United States Patent [19]
Kawanishi et al.

[11] Patent Number: 4,879,725
[45] Date of Patent: Nov. 7, 1989

[54] SEMICONDUCTOR LASER DEVICE HAVING EXTENDED FACET LIFE

[75] Inventors: Hidenori Kawanishi, Higashiosaka; Masahiro Yamaguchi, Tokai; Hiroshi Hayashi, Kyoto; Taiji Morimoto; Shinji Kaneiwa, both of Nara, all of Japan

[73] Assignee: Sharp Kabushiki Kaisha, Osaka, Japan

[21] Appl. No.: 238,728

[22] Filed: Aug. 30, 1988

[30] Foreign Application Priority Data

Sep. 4, 1987 [JP] Japan .............................. 62-222766

[51] Int. Cl.$^4$ ................................................ H01S 3/19
[52] U.S. Cl. ........................................ 372/48; 372/46
[58] Field of Search ........................ 372/44, 45, 46, 48

[56] References Cited
U.S. PATENT DOCUMENTS 4,730,328  3/1988  Miyauchi et al. .................. 372/46
4,769,821  9/1988  Gotoh .................................. 372/46
4,791,649  12/1988  Yamamoto et al. .................. 372/46

Primary Examiner—James W. Davie
Attorney, Agent, or Firm—Irell & Manella

[57] ABSTRACT

A semiconductor laser device comprises a p-type semiconductor substrate and a multi-layered crystal structure with an active layer for laser-oscillating operation, the multi-layered crystal structure being disposed on the substrate and having a striped channel area through which current is supplied to the active layer and a light-absorbing area positioned outside of the channeled area by which a difference between the amount of light to be absorbed inside of the channeled area and the amount of light to be absorbed outside of the channeled area is created, which causes a difference in the effective refractive index of the active layer, resulting in an optical waveguide in the active layer, wherein the light-absorbing area is constituted by an n-type semiconductor substance, but a portion of the n-type semiconductor substance positioned in the vicinity of at least one of both facets is replaced by a p-type semiconductor substance.

5 Claims, 4 Drawing Sheets

<Oscillation Direction>

SEMICONDUCTOR LASER DEVICE HAVING EXTENDED FACET LIFE

BACKGROUND OF THE INVENTION

1. Field of the invention:

This invention relates to a semiconductor laser device with a structure by which the rise of the temperature of the facets that is caused by the light absorption of the facets can be prevented, thereby attaining stabilized laser oscillation for a long period of time even at high output power.

2. Description of the prior art:

Semiconductor laser devices that can oscillate coherent light have been used as light sources in optical disc apparatuses, optical communication systems, etc. As optical disc apparatuses, there have been add-on-memory type optical disc apparatuses that achieve writing operation and erasable memory type optical disc apparatuses that achieve erasable operation. Semiconductor laser devices that are used as light sources in these optical disc apparatuses are required to produce optical output power as high as 20–40 mW. For this purpose, in recent years, high output power semiconductor laser devices have been put into practice. The high output power semiconductor laser devices are disadvantageous in that the light-emitting facet thereof tends to deteriorate. It has been reported that high output power semiconductor laser devices oscillating laser light at high output power deteriorate in inverse proportion to the fourth power of the optical output in the cases where semiconductor laser devices with the same structure are examined.

FIG. 6 shows a conventional VSIS (V-channeled substrate inner stripe) semiconductor laser device, which is produced as follows: On a p-GaAs substrate 11, an n-GaAs current blocking layer 12 is formed. Then, a V-channel with a width W1 is formed on the current blocking layer 12 in such a manner that the V-channel reaches the substrate 11 through the current blocking layer 12. On the current blocking layer 12 including the V-channel, a p-GaAlAs cladding layer 13, a GaAs or GaAlAs active layer 14, an n-GaAlAs cladding layer 15, and an n-GaAs cap layer 16 are successively formed. Current for laser oscillation is confined by the n-GaAs current blocking layer 12 and only flows into the channel with a width W1. Laser light that is produced in the active layer 14 is absorbed by the n-GaAs current blocking layer 12 that is positioned outside of the V-channel, so that a difference arises in the effective refractive index between the portion of the active layer 14 corresponding to the V-channel and the other portions of the active layer 14 corresponding to the outside of the V-channel, resulting in an optical waveguide in the active layer 14. Thus, laser oscillation can be attained in a stabilized fundamental transverse mode. The said waveguiding structure functions as a loss-waveguide structure. This VSIS laser device is disadvantageous in that although it can attain laser oscillation in a stabilized fundamental transverse mode at a low output power level, it cannot continue to oscillate laser light for a long period of time at a high output power level with extreme reliability. The reasons why the above-mentioned laser device deteriorates at a high output power level are based on the deterioration of the shoulders of the V-channel in the vicinity of the facets, which is caused by heat generation of the n-GaAs current blocking layer 12 corresponding to the shoulder portions of the V-channel that absorbs light that leaks from the optical waveguide. The diffusion length of the minority carrier within the n-GaAs current blocking layer 12 is short, so that the carrier that is produced by the light absorption achieves a non-radiative recombination in the vicinity of the shoulder portions of the V-channel, resulting in the generation of heat.

SUMMARY OF THE INVENTION

The semiconductor laser device of this invention, which overcomes the above-discussed and numerous other disadvantages and deficiencies of the prior art, comprises a p-type semiconductor substrate and a multi-layered crystal structure with an active layer for laser-oscillating operation, the said multi-layered crystal structure being disposed on said substrate and having a striped channel area through which current is supplied to said active layer and a light-absorbing area positioned outside of said channeled area by which a difference between the amount of light to be absorbed inside of said channeled area and the amount of light to be absorbed outside of said channeled area is created, which causes a difference in the effective refractive index of said active layer, resulting in an optical waveguide in said active layer, wherein said light-absorbing area is constituted by an n-type semiconductor substance, but a portion of said n-type semiconductor substance positioned in the vicinity of at least one of both facets is replaced by a p-type semiconductor substance.

In a preferred embodiment, the entire portion of said n-type semiconductor substance that is positioned in the vicinity of at least one facet is replaced by said p-type semiconductor substance.

In a preferred embodiment, the upper portion of said n-type semiconductor substance that is positioned in the vicinity of at least one facet is replaced by said p-type semiconductor substance and the lower portion thereof remains.

In a preferred embodiment, the portion with a limited width of said n-type semiconductor substance that is positioned in the vicinity of at least one facet is replaced by said p-type semiconductor substance.

In a preferred embodiment, the upper portion with a limited width of said n-type semiconductor substance that is positioned in the vicinity of at least one facet is replaced by said p-type semiconductor substance and the lower portion thereof remains.

Thus, the invention described herein makes possible the objective of providing a loss-waveguide semiconductor laser device in which the portions of an n-type light-absorbing area that constitutes a waveguide are made of a p-type semiconductor substance in the vicinity of the facets, so that the rise of the temperature of the facets that is caused by the light absorption can be prevented and the deterioration of the facets can be suppressed even at high output power operation, thereby attaining laser oscillation with extreme reliability even at a high output power level.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor laser device in which the portions of a light-absorbing area in the vicinity of the facets are made of a p-type semiconductor substance in which the diffusion length of the minority carrier is long, so that the rise of the temperature of the facets that is caused by the light absorption can be prevented and the deterioration of the facets can be suppressed even at high output power operation, thereby attaining laser oscillation with extreme reliability even at a high output power level.

EXAMPLE 1

Figure 1:
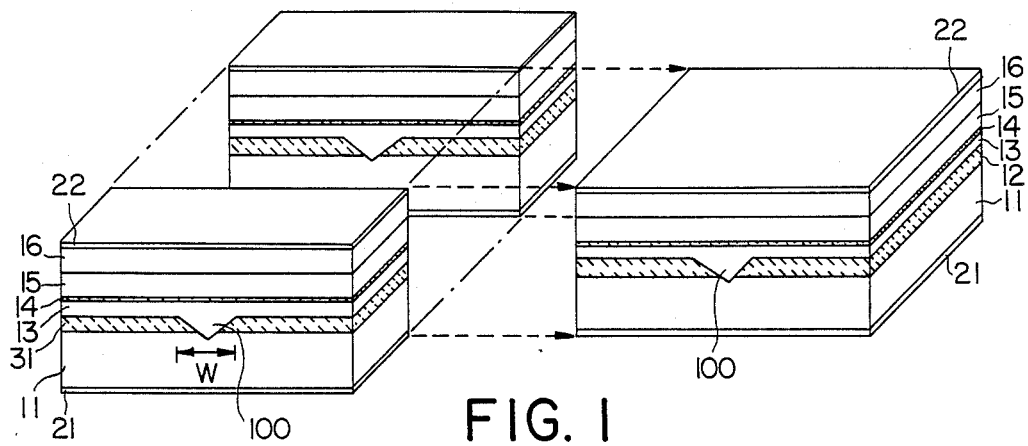
FIG. 1 is a perspective view showing the decomposition of a VSIS semiconductor laser device of this invention.
Figure 2A:
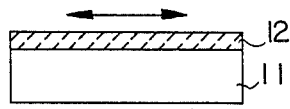
FIGS. 2A to 2C are schematic diagrams showing a production process of the semiconductor laser device shown in FIG. 1.
Figure 2B:
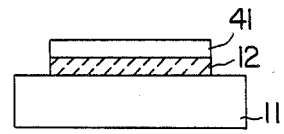
Figure 2C:
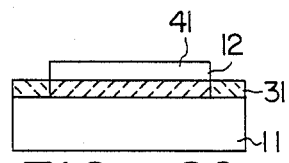

FIG. 1 shows a VSIS semiconductor laser device of this invention, which is produced as follows: As shown in FIG. 2A, on a p-GaAs substrate 11, a current blocking layer (that constitutes a light-absorbing area) 12 with a thickness of 0.7 μm is formed by liquid phase epitaxy. As shown in FIG. 2B, the portions of the n-GaAs current blocking layer 12 in the vicinity of the facets are removed over a length of 10 μm each in the oscillation direction by an etching technique by the use of an SiO$_2$ film 41 as a masking means. Then, as shown in FIG. 2C, by the organic metal thermal decomposition method a p-GaAs layer 31 with a thickness of 0.7 μm is selectively formed on the exposed portions of the p-GaAs substrate 11 from which the n-GaAs current blocking layer 12 has been removed. The SiO$_2$ film 41 is then removed. The p-GaAs layer 31 is flush with the remaining n-GaAs layer 12 because both layers 31 and 12 are formed with the same thickness on the substrate 11. Then, a V-channel 100 with a width of 4 μm and a depth of 1 μm is formed into a stripe such that it reaches the p-GaAs substrate 11 through the n-GaAs current blocking layer 12, resulting in a current path. Then, on the n-GaAs current blocking layer 12 including the V-channel 100, a p-Al$_{0.42}$Ga$_{0.58}$As cladding layer 13 with a thickness of 0.15 μm at the outside of the V-channel 100, a p- or nAl$_{0.14}$Ga$_{0.86}$active layer 14 with a thickness of 0.08 μm, an n-Al$_{0.42}$Ga$_{0.58}$As cladding layer 15 with a thickness of 0.8 μm, and an n-GaAs contact layer 16 with a thickness of 1.5 μm are successively formed by liquid phase epitaxy in the same way as the growth method for use in conventional VSIS semiconductor laser devices. According to liquid phase epitaxy, the pAl$_{0.42}$Ga$_{0.58}$As cladding layer 13 is formed on the n-GaAs current blocking layer 12 including the V-channel 100 so that the top surface thereof becomes flat, and accordingly the Al$_{0.14}$Ga$_{0.86}$As active layer 14 that is formed on the said flat cladding layer 13 becomes flat and uniform over the entire surface thereof.

Thereafter, a p-side electrode 21 and an n-side electrode 22 are formed on the bottom face of the substrate 11 and the top surface of the contact layer 16, respectively, followed by cleaving the wafer, resulting in a semiconductor laser device with a FabryPérot resonator for laser oscillation.

The transverse mode that is attained by this semiconductor laser device is stabilized because light that leaks from the optical waveguide of the active layer 14 is absorbed by both the n-GaAs layer 12 and the p-GaAs layer 31 without the heat generation of the facets. The reasons therefor are as follows: In the vicinity of the facets that receive light with a high optical intensity, the p-GaAs layer 31 attains the absorption of light. Although electron-holes pairs are generated in the vicinity of the shoulder portions of the V-channel, because the relaxation time of the minority carrier (i.e., electrons) of the p-GaAs layer 31 is relatively long, the electrons do not relax in the vicinity of the shoulder portions of the V-channel but they move to a place that is far from the said shoulder portions and relax therein, which causes the generation of heat. Thus, the heat generation does not arise in the shoulder portions of the V-channel, but it arises over the whole light-absorbing area including the n-GaAs layer and the p-GaAs layer, so that the rise of the temperature of local portions of the light-absorbing area can be suppressed. Therefore, the deterioration of the facets based on the heat generation of the shoulder portions of the V-channel does not occur in the semiconductor laser device of this invention, and the said semiconductor laser device can attain laser oscillation with extreme reliability even at high output power operation. When the light-emitting facet was coated with a substance with a reflectivity of 4% and the other facet was coated with a substance with a reflectivity of 97%, the facets of the semiconductor laser device were not deteriorated even at high output power operation, 100 mW.

EXAMPLE

Figure 3:
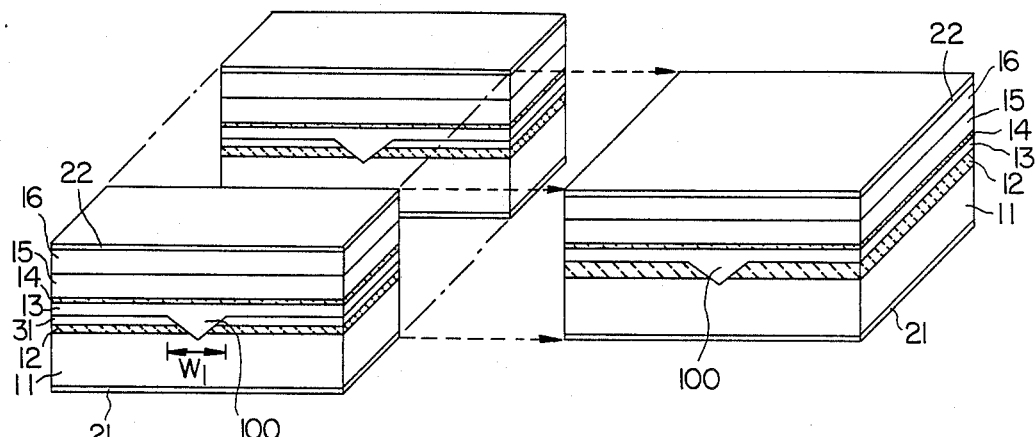
FIG. 3 is a perspective view showing the decomposition of another VSIS semiconductor laser device of this invention.

FIG. 3 shows another VSIS semiconductor laser device of this invention, which is produced in the same way as that of Example 1, except that the portions of the n-GaAs current blocking layer 12 in the vicinity of the facets are not completely removed, but the upper portions only thereof are removed and the lower portions thereof remain. The p-GaAs layer 31 is formed on the remaining portions of the n-GaAs current blocking layer 12 in the vicinity of the facets. In this way, the shoulder portions of the V-channel 100 in the vicinity of the facets are constituted by the p-GaAs layer 31, so that the heat generation of local areas of the light-absorbing layers 12 and 31 can be suppressed for the same reasons as mentioned above. Moreover, current is confined by the n-GaAs layer 12 that underlies the p-GaAs layer 31 even in the vicinity of the facets, so that the threshold current of this semiconductor laser device is less than that of the semiconductor laser device of Example 1. When the light-emitting facet was coated with a substance with a reflectivity of 4% and the other facet was coated with a substance with a reflectivity of 97%, these facets of this semiconductor laser device did not deteriorate even at high output power operation, 100 mW.

EXAMPLE 3

Figure 4:
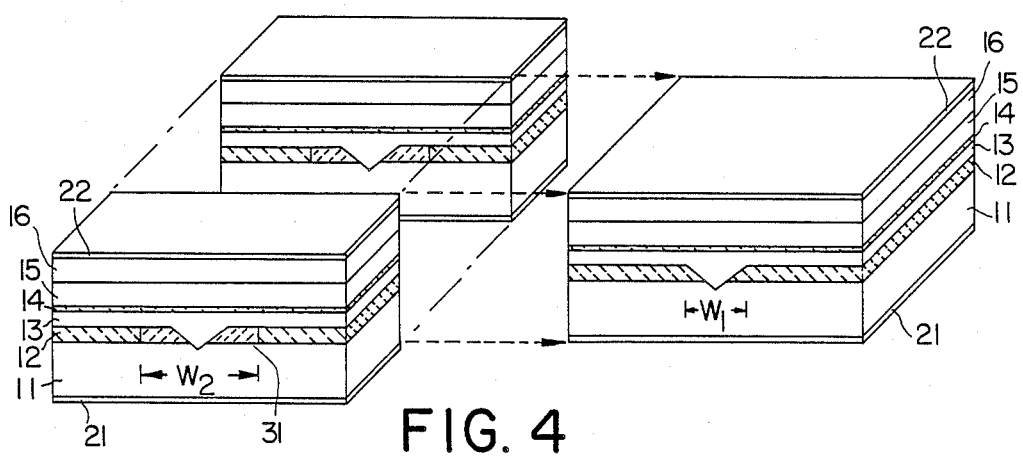
FIG. 4 is a perspective view showing the decomposition of another VSIS semiconductor laser device of this invention.
Figure 5A:
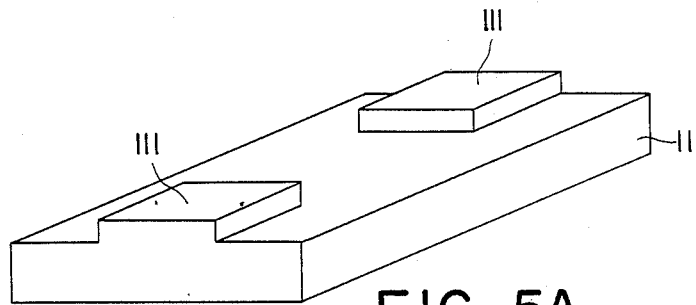
FIGS. 5A to 5D are schematic diagrams showing a production process of the semiconductor laser device shown in FIG. 4.
Figure 5B:
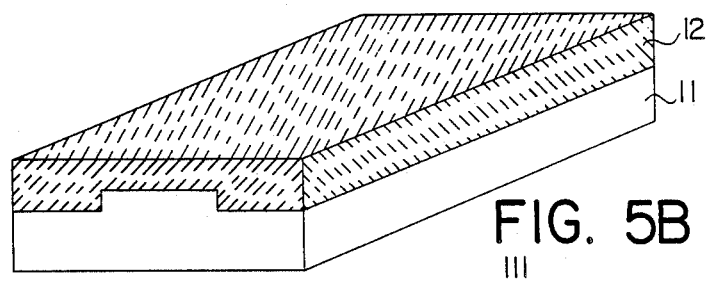
Figure 5C:
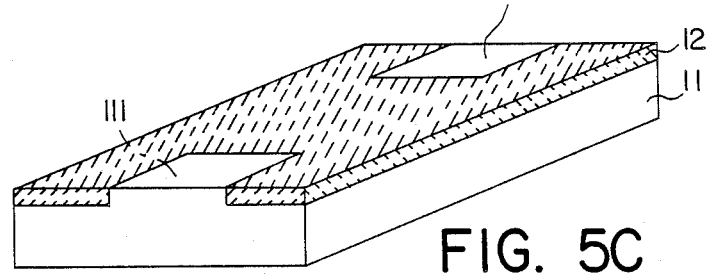
Figure 5D:
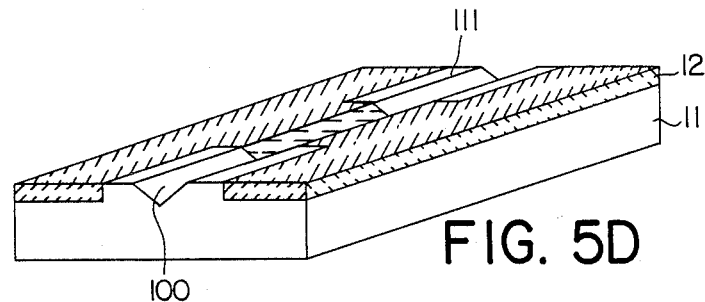
Figure 6:
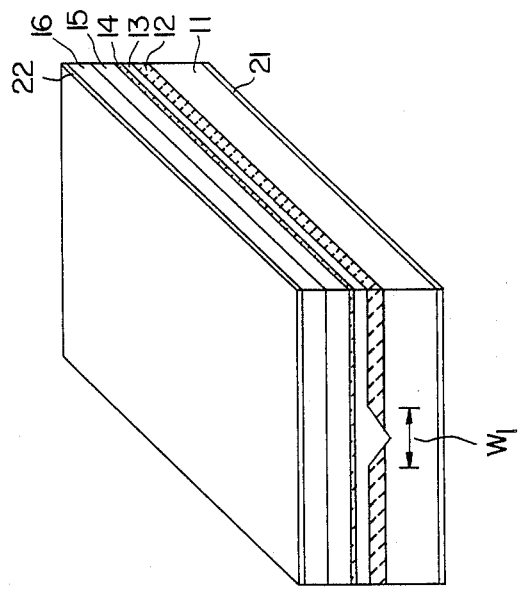
FIG. 6 is a perspective view showing a conventional VSIS semiconductor laser device.

FIG. 4 shows another VSIS semiconductor laser device of this invention, in which the p-GaAs layer 81 with a width of W2 (W2 > W1) is disposed instead of the n-GaAs current blocking layer 12 in the vicinity of the facets. The portions with a width W2 of the current path in the vicinity of the facets are defined by the n-GaAs current blocking layer 12 that is positioned outside of the p-GaAs layer 31, and the threshold current of this semiconductor laser device is less than that of the semiconductor laser device of Example 1. When the value of W2 was set to be 10 μm and the light-emitting facet and the other facet were coated with substances with reflectivities of 4% and 97%, respectively, these facets of this semiconductor laser device did not deteriorate even at high output power operation, 100 mW.

The semiconductor laser device shown in FIG. 4 can be produced by a process shown in FIG. 5: As shown in FIG. 5A, mesa portions 111 with a length of 10 μm in the oscillation direction and a height of 1.0 μm are formed on the portions of a p-GaAs substrate 11 in the vicinity of the facets by photolithography and an etching technique. Then, as shown in FIG. 5B, on the p-GaAs substrate 11 with the mesa portions 111, an n-GaAs layer 12 with a thickness of 2.0 μm at the outside of the mesa portions 111 is formed by liquid phase epitaxy. As mentioned in Example 1, by the use of liquid phase epitaxy as a crystal growth technique, the n-GaAs layer 12 becomes flat over the entire surface thereof. Thereafter, the wafer is etched so that the thickness of the n-GaAs layer 12 becomes 0.7 μm at the outside of the mesa portions 111, and as shown in FIG. 5C, the top surface of each of the mesa portions 111 is exposed to the outside. Then, as shown in FIG. 5D, a V-channel 100 with a width of 4 μm and a depth of 1 μm is formed into a stripe from one facet to the other facet so that it reaches the p-GaAs substrate 11 via the n-GaAs layer 12. Then, a p-AlGaAs cladding layer 13, a p- or n-AlGaAs active layer 14, a p-AlGaAs cladding layer 15, and an n-GaAs contact layer 16 are formed on both the n-GaAs layer 12 and the p-GaAs mesa portions 111 including the V-channel 100 in the same way as mentioned in Example 1, resulting in a semiconductor laser device shown in FIG. 4.

EXAMPLE 4

Another VSIS semiconductor laser device of this invention is obtainable in which the structure of the laser device of FIG. 4 is incorporated into the structure of the laser device of FIG. 3. The lower portions of the p-GaAs layer 31 in the vicinity of the facets shown in FIG. 4 are replaced by the n-GaAs layer over the width of W2. Thus, the n-GaAs layer underlies the p-GaAs layer over the width of W2 in the vicinity of the facets, whereby the same effect as mentioned above can be attained.

Although the above-mentioned examples disclose device structures that a p-GaAs layer is disposed on both facet sides, the p-GaAs layer can be disposed on the light-emitting facet side alone. This invention is also applicable t optical waveguide structures other than those described herein. Moreover, although the above-mentioned examples disclose only liquid phase epitaxy as a crystal growth technique, molecular beam epitaxy, metal organic-chemical vapor deposition, the thermal decomposition method, vapor phase epitaxy, and so on can be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a p-type semiconductor substrate and a multi-layered crystal structure with an active layer for laser-oscillating operation, the said multi-layered crystal structure being disposed on said substrate and having a striped channel area through which current is supplied to said active layer and a light-absorbing area positioned outside of said channeled area by which a difference between the amount of light to be absorbed inside said channeled area and the amount of light to be absorbed outside said channeled area is created, which causes a difference in the effective refractive index of said active layer, resulting in an optical waveguide in said active layer, wherein said light-absorbing area comprises a p-type semiconductor substance in the vicinity of at least one of both facets, and comprises an n-type semiconductor where it is not a p-type semiconductor.

2. A semiconductor laser device according to claim 1, wherein the entire portion of said light-absorbing area that is positioned in the vicinity of at least one facet comprises p-type semiconductor substance.

3. A semiconductor laser device according to claim 1, wherein the upper portion of said light-absorbing area that is positioned in the vicinity of at least one facet comprises p-type semiconductor substance and the lower portion thereof comprises n-type semiconductor.

4. A semiconductor laser device according to claim 1, wherein a portion of said light-absorbing area having limited width that is positioned in the vicinity of at least one facet comprises p-type semiconductor substance.

5. A semiconductor laser device according to claim 1, wherein the upper portion of said light-absorbing area having a limited width that is positioned in the vicinity of at least one facet comprises p-type semiconductor substance and the rest of said light-absorbing area comprises n-type semiconductor substance.

* * * * *